United States Patent
Snow

(10) Patent No.: US 7,991,171 B1
(45) Date of Patent: Aug. 2, 2011

(54) METHOD AND APPARATUS FOR PROCESSING AN AUDIO SIGNAL IN MULTIPLE FREQUENCY BANDS

(75) Inventor: Gary C Snow, New Bern, NC (US)

(73) Assignee: Wheatstone Corporation, New Bern, NC (US)

( * ) Notice: Subject to any disclaimer, the term of this patent is extended or adjusted under 35 U.S.C. 154(b) by 1139 days.

(21) Appl. No.: 11/734,947

(22) Filed: Apr. 13, 2007

(51) Int. Cl.
*H03G 9/00* (2006.01)

(52) U.S. Cl. .......................................... 381/102; 381/98

(58) Field of Classification Search ................ 381/1, 98, 381/96, 28, 109, 102, 103, 94.3, 56, 106, 381/107; 700/94

See application file for complete search history.

(56) References Cited

U.S. PATENT DOCUMENTS

| | | | |
|---|---|---|---|
| 3,989,897 A | 11/1976 | Carver | |
| 4,232,381 A | 11/1980 | Rennick et al. | |
| 4,329,714 A | 5/1982 | Pritchard | |
| 4,736,432 A | 4/1988 | Cantrell | |
| 4,939,782 A | 7/1990 | Gambacurta, Jr. et al. | |
| 5,416,847 A | 5/1995 | Boze | |
| 6,694,029 B2 | 2/2004 | Curtis et al. | |
| 6,865,430 B1 | 3/2005 | Runton et al. | |
| RE38,822 E | 10/2005 | Aarts et al. | |
| 7,003,120 B1* | 2/2006 | Smith et al. ..................... | 381/61 |
| 7,574,009 B2* | 8/2009 | Aubauer et al. ................ | 381/98 |
| 7,587,054 B2* | 9/2009 | Elko et al. ....................... | 381/92 |
| 2003/0002684 A1 | 1/2003 | Coats | |
| 2004/0071297 A1 | 4/2004 | Katou et al. | |
| 2004/0234083 A1* | 11/2004 | Katou et al. .................. | 381/101 |

* cited by examiner

*Primary Examiner* — Xu Mei
*Assistant Examiner* — Lun Lao
(74) *Attorney, Agent, or Firm* — DeLio & Peterson, LLC; Kelly M. Nowak

(57) ABSTRACT

A method and apparatus for processing an audio signal in multiple audio frequency bands while minimizing undesirable changes in tonal qualities of the audio signal by determining an initial gain adjustment factor for each audio frequency band resulting from the application of an audio processing technique. A final gain adjustment factor for each band is selected from a corresponding set of weighted or unweighted initial gain adjustment factors. The set of initial gain adjustment factors from which the final gain adjustment factor for a specified audio frequency band is obtained is derived from other audio frequency bands that have the frequency of the specified band as a harmonic frequency. Changes in audio signal level within one audio frequency band thereby affect the signal level of harmonic frequencies to decrease relative changes in volume between a fundamental frequency and its harmonics.

23 Claims, 2 Drawing Sheets

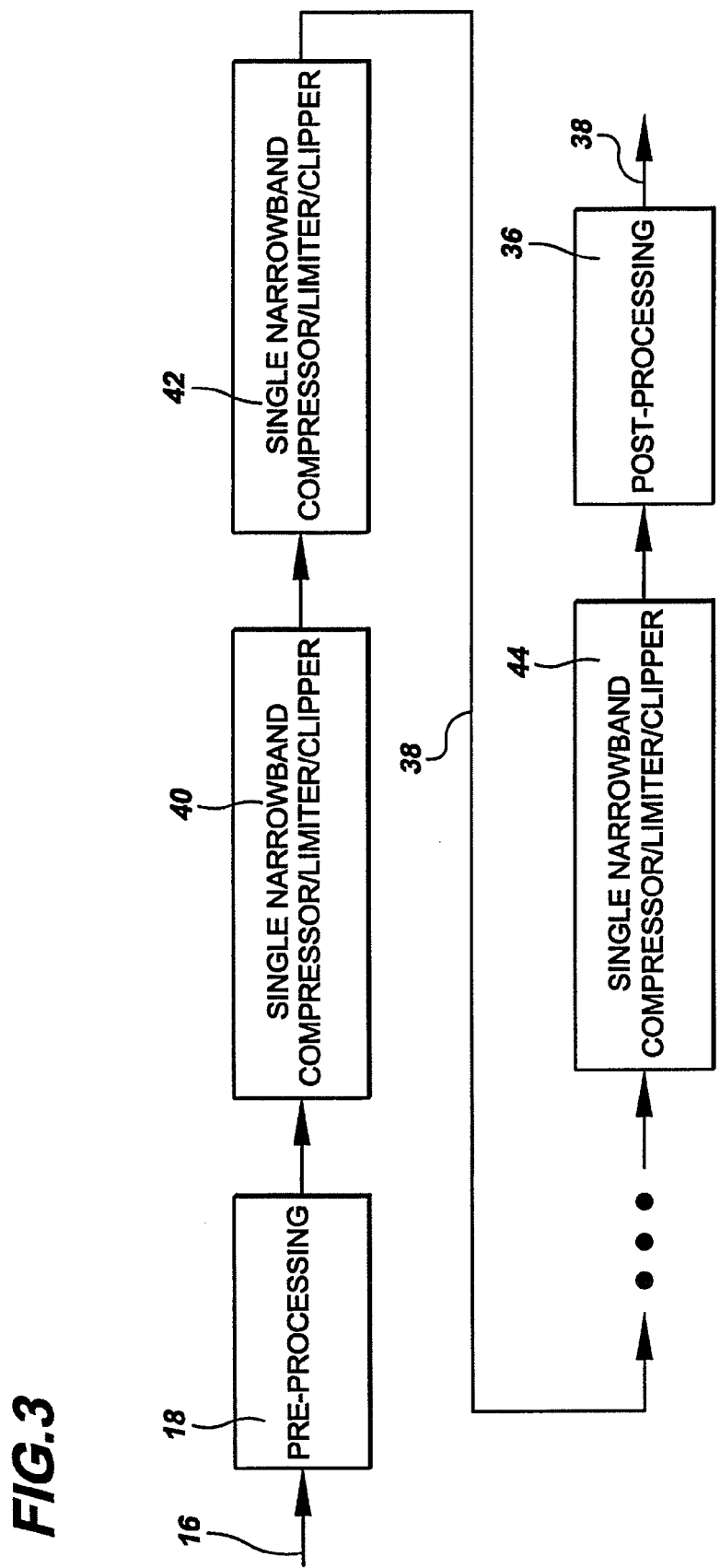

METHOD AND APPARATUS FOR PROCESSING AN AUDIO SIGNAL IN MULTIPLE FREQUENCY BANDS

BACKGROUND OF THE INVENTION

1. Field of the Invention

The present invention relates to audio signal processing and in particular to a method and apparatus for adjusting the relative amplitudes of different frequency bands in an audio signal while minimizing undesirable changes in tonal qualities of the audio signal.

2. Description of Related Art

One known method of audio signal processing is to process the audio signal in the frequency spectrum by separating the audio signal into multiple audio signals that fall within spaced audio frequency bands. This separation of the audio spectrum into audio frequency bands can be achieved with analog or digital techniques. The audio signals having frequencies that fall within each frequency band are processed using an audio processing technique and the processed signals are then combined to form a final processed audio output signal.

In the most common form of this multi-band audio signal processing method the amplitude of the signal in each audio frequency band is varied by a fixed or adjustable amount that is independent of the signal within each audio frequency band. The amplitude change in a single audio frequency band will be referred to herein as a "gain adjustment factor." The gain adjustment factor may be independent of the signals within the audio band, or it may vary and be the result of applying a specific audio processing technique to a varying audio signal within the audio band.

When the gain adjustment factors are independent of each other and of the input signal, this type of audio signal processing method can be considered to be a general-purpose audio filter. The gain adjustment factors may be externally provided and selected to produce a low pass audio filter, a high pass filter, a band pass filter, a band stop filter or other known type of audio filter. A device having this type independent and relatively static adjustment of the gain for different audio frequency bands may be referred to as an audio equalizer.

Audio signal processing methods of this type typically use a reduction of signal amplitude during signal processing to adjust the relative signal amplitudes. The term "gain adjustment factor" is used herein to indicate that signal amplitude within an audio frequency band may be decreased or increased.

In the general purpose audio filter processing method described above, the audio signal in each frequency band is simply changed in amplitude by an externally provided gain adjustment factor. In a related known type of audio signal processing method, the gain adjustment factors are not static and are not independent of the audio signal being processed. The audio signal in each audio frequency band is processed with a more complex audio processing technique such as by applying audio compression, signal amplitude limiting or another known type of audio signal processing. This type of audio signal processing produces an associated gain adjustment factor for each frequency band that dynamically changes depending upon the audio signal within that band as well as upon the specific audio processing technique applied to the audio signal in that band.

In both the simple static design and the dynamic design, digital and analog processing techniques may be used. In each of these known processing techniques, however, the gain adjustment factor for each audio frequency band is independent of the gain adjustment factor in the other audio frequency bands.

One defect in all such audio signal processing techniques is that they tend to produce undesirable changes in the timbre or tone of musical instruments. When an instrument plays a note with a fundamental frequency F, the sound produced will include additional harmonic frequencies at twice the fundamental, (i.e. at frequency=2F–referred to as the "second harmonic" of the fundamental frequency) and at three times the fundamental (frequency=3F–referred to as the "third harmonic"), etc.

The tonal quality and timbre of the sound produced by an instrument when a note is struck is dependent, in large part, upon the amplitude relationships between the fundamental and harmonic frequencies. When an audio signal is processed by one of the known methods described above, the amplitudes of the audio signals in different audio frequency bands are independently changed. The amplitude relationships between the fundamental and the harmonic frequencies are changed whenever the fundamental and harmonic frequencies fall into different frequency bands. This can produce a highly undesirable change in the quality of the sound of an instrument or a singer's voice, etc.

For example, when an audio frequency band of containing frequency f is processed, that band will include not only the fundamental frequency f for instruments playing a note of frequency f, but also the second harmonic of instruments playing a note of frequency f/2 and the third harmonic of instruments playing a note of frequency f/3.

In conventional devices that operate according to the method described above, a relatively small number of frequency bands are used. In devices that separate the audio signal into a relatively small number of bands (three to eight is common) it is likely that adjacent harmonics will be in the same band. This results in the same gain adjustment factor for the fundamental and the close harmonics, reducing undesirable changes in timbre, tone and sound quality.

However, there is a need for audio signal processors that can provide more fine-grained control of the audio spectrum. As the number of frequency bands is increased, the width of each frequency band is narrowed. Each harmonic frequency then falls into a different audio frequency band from the fundamental and will be adjusted in amplitude by a different corresponding gain adjustment factor. As the relationships between the fundamental and its harmonic frequencies is changed by the different independent gain adjustment factors, the tone and timbre of instruments and music is adversely affected.

In this application, the term "primary band frequency" will be used to refer to a frequency within an audio frequency band that characterizes that audio frequency band. It may be the center frequency of an analog bandpass filter, or it may be a frequency defined in a digital processing technique used to separate the audio frequency bands for digital processing, etc.

A primary band frequency of a first audio frequency band may be a fundamental frequency with respect to the primary band frequency of a second audio frequency band. The higher frequency second primary band frequency would be a harmonic of the lower first primary band frequency. At the same time the first primary band frequency may also be a harmonic of a third primary band frequency. The third primary band frequency would be at a lower frequency than the first or second and would be a fundamental frequency with respect to the first.

By way of example, the first primary band frequency might be located at 1000 Hz, the second might be located above the first at 2000 Hz and the third might be locate below the first at 500 Hz. The second primary band frequency at 2000 Hz is the second harmonic of the first primary band frequency located at 1000 Hz. The first primary band frequency at 1000 Hz is the second harmonic of the third primary band frequency at 500 Hz.

SUMMARY OF THE INVENTION

Bearing in mind the problems and deficiencies of the prior art, it is therefore an object of the present invention to provide a method and apparatus for processing an audio signal that allows fine grained control of an audio spectrum while reducing adverse effects on tone quality and timbre.

Still other objects and advantages of the invention will in part be obvious and will in part be apparent from the specification. The above and other objects, which will be apparent to those skilled in the art, are achieved in the present invention, which is directed to a method and apparatus for processing an audio signal in mutiple audio frequency bands. The preferred method includes the steps of:

separating the audio signal into multiple audio frequency bands, each audio frequency band having a corresponding primary band frequency, at least some of the primary band frequencies being harmonics of other primary band frequencies;

processing the audio signal in each audio frequency band with an associated audio processing technique;

determining an initial gain adjustment factor for each primary band frequency, the initial gain adjustment factor for each primary band frequency being determined from the audio processing technique as applied to the audio signal in the corresponding audio frequency band;

identifying a set of initial gain adjustment factors for each primary band frequency that is a harmonic of at least one other primary band frequency, the set of initial gain adjustment factors including at least:

the initial gain adjustment factor corresponding to the primary band frequency, and, the initial gain adjustment factor corresponding to the at least one other primary band frequency;

selecting a final gain adjustment factor for each audio frequency band from the corresponding set of initial gain adjustment factors;

applying each final gain adjustment factor to the corresponding audio frequency band to produce a processed and gain adjusted audio signal for each audio frequency band; and mixing the processed and gain adjusted audio signals from each audio frequency band to produce a final processed audio signal.

In one aspect of the method, the step of selecting a final gain adjustment factor for each audio frequency band from the corresponding set of initial gain adjustment factors comprises selecting the initial gain adjustment factor from the corresponding set of initial gain adjustment factors that produces the maximum change in audio signal amplitude.

The step of selecting a final gain adjustment factor for each audio frequency band from the corresponding set of initial gain adjustment factors may include selecting the initial gain adjustment factor that produces the greatest reduction in audio signal amplitude.

In another aspect of the invention, the set of initial gain adjustment factors for each primary band frequency includes, at least, 1) the initial gain adjustment factor corresponding to the primary band frequency for the set, 2) the initial gain adjustment factor corresponding to a second primary band frequency, the primary band frequency for the set comprising a second harmonic of the second primary band frequency; and 3) the initial gain adjustment factor corresponding to a third primary band frequency, the primary band frequency for the set comprising a third harmonic of the third primary band frequency;

The method may also include the step of weighting one or more gain adjustment factors in each set of initial gain adjustment factors and selecting a weighted one of the initial gain adjustment factors as the final gain adjustment factor. The step of weighting one or more gain adjustment factors in each set preferably includes weighting according to the harmonic level relationship between the primary band frequencies that correspond to the gain adjustment factors in each set of initial gain adjustment factors.

Weighting by increasing or decreasing harmonic components may be used and it is preferred to select as the final gain adjustment factor the weighted initial gain adjustment factor from each corresponding set of weighted gain adjustment factors that produces the maximum change in audio signal amplitude. When all gain adjustment factors are gain reductions, the selected final gain adjustment factor is the weighted initial gain adjustment factor that produces the maximum reduction in signal amplitude.

In the preferred embodiment, each set of initial gain adjustment factors, except at the very lowest frequencies, defines a corresponding set of primary band frequencies and each set of primary band frequencies includes a lowest frequency, a second harmonic of the lowest frequency and a third harmonic of the lowest frequency. The initial gain adjustment factor corresponding to the lowest frequency is weighted by a first weighting factor, the initial gain adjustment factor corresponding to the second harmonic of the lowest frequency is weighted by a second weighting factor and the initial gain adjustment factor corresponding to the third harmonic of the lowest frequency is weighted by a third weighting factor.

The method may be practiced by processing the audio frequency bands in parallel or in serial. In the parallel configuration the step of separating the audio signal into multiple audio frequency bands for all audio frequency bands occurs before the step of processing the audio signal in each audio frequency band. In the serial configuration each band is separated, processed and then added back to the complete signal before processing for the next audio frequency band. In the serial method, processing of audio frequency bands proceeds from lower frequencies to higher frequencies.

After each audio frequency band is processed, an amplitude adjustment factor may be applied to that band that is independent of the final gain adjustment factor for that band. In the preferred method, the audio signal is separated into more than 30 distinct audio frequency bands.

The audio signal may optionally be pre-processed with at least one audio processing technique before the audio signal is separated into multiple audio frequency bands. The audio signal may also be post-processed with another audio processing technique after the processed audio frequencies are mixed. Pre-processing or post-processing may be applied to the parallel or serial implementations of the invention.

The invention also includes an apparatus for processing an audio signal comprising:

an input for receiving the audio signal;

an audio signal processor for processing the audio signal in each audio frequency band with an associated audio processing technique;

the audio signal processor separating the audio signal into multiple audio frequency bands, each audio frequency band having a corresponding primary band frequency, at least some of the primary band frequencies being harmonics of other primary band frequencies;

the audio signal processor determining an initial gain adjustment factor for each primary band frequency, the initial gain adjustment factor for each primary band frequency being determined from the audio processing technique as applied to the audio signal in the corresponding audio frequency band;

the audio signal processor identifying a set of initial gain adjustment factors for each primary band frequency that is a harmonic of at least one other primary band frequency, the set of initial gain adjustment factors including at least:

the initial gain adjustment factor corresponding to the primary band frequency, and, the initial gain adjustment factor corresponding to the at least one other primary band frequency;

the audio signal processor selecting a final gain adjustment factor for each audio frequency band from the corresponding set of initial gain adjustment factors;

the audio signal processor applying each final gain adjustment factor to the corresponding audio frequency band to produce a processed and gain adjusted audio signal for each audio frequency band; and the audio signal processor mixing the processed and gain adjusted audio signals from each audio frequency band to produce a final processed audio signal, and an output for outputting the processed audio signal.

The audio signal processor is preferably a digital signal processor, but additional analog or digital processors and components may also be incorporated to form the complete audio signal processor. The audio signal processor may incorporate any aspect of the method of this invention as summarized above and described in more detail below.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 3 is a block diagram showing the serial processing method of operation of the audio signal processor in FIG. 1.

DESCRIPTION OF THE PREFERRED EMBODIMENT(S)

In describing the preferred embodiment of the present invention, reference will be made herein to FIGS. 1-3 of the drawings in which like numerals refer to like features of the invention.

Figure 1:
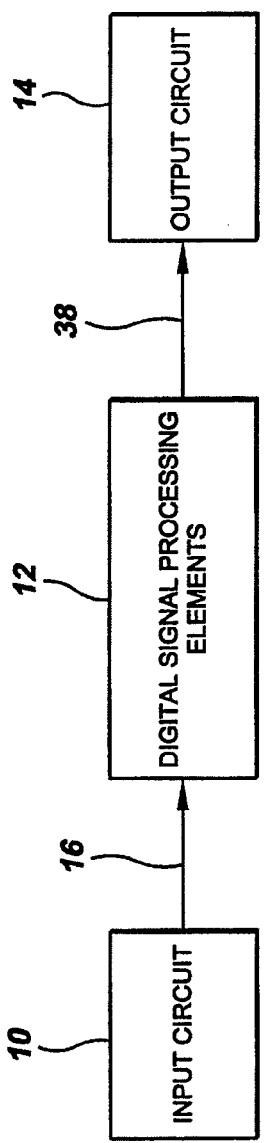
FIG. 1 is a block diagram of an apparatus according to the present invention showing an input, an output and an audio signal processor that operates according to the method of the present invention.

Referring to FIG. 1, an apparatus according to the present invention includes an input circuit 10, an audio signal processor 12 and an output circuit 14. The input circuit may be any of a number of interface circuits for accepting analog or digital audio data, such as an analog to digital converter (ADC), an S/PDIF receiver, an AES/EBU receiver, a USB interface or an Ethernet interface.

The audio signal processor 12 may comprise one or more analog or digital processing units. Available digital processing units include fixed point digital signal processors (DSPs), floating point DSPs, field programmable gate arrays (FPGAs), application specific integrated circuits (ASIC), general-purpose microcontrollers and general-purpose microprocessors. Partial or complete implementation with analog components is also feasible, although complete implementation in an analog design may not be cost effective.

The output circuit 14 may be any type of known analog or digital interface circuit for transmitting analog or digital audio data, including a digital to analog converter (DAC), an S/PDIF transmitter, an AES/EBU transmitter, a USB interface and/or an Ethernet interface. Audio signal compression and decompression as well as the implementation of various types of audio signal encoding may optionally be integrated into the input and output circuits.

Figure 2:
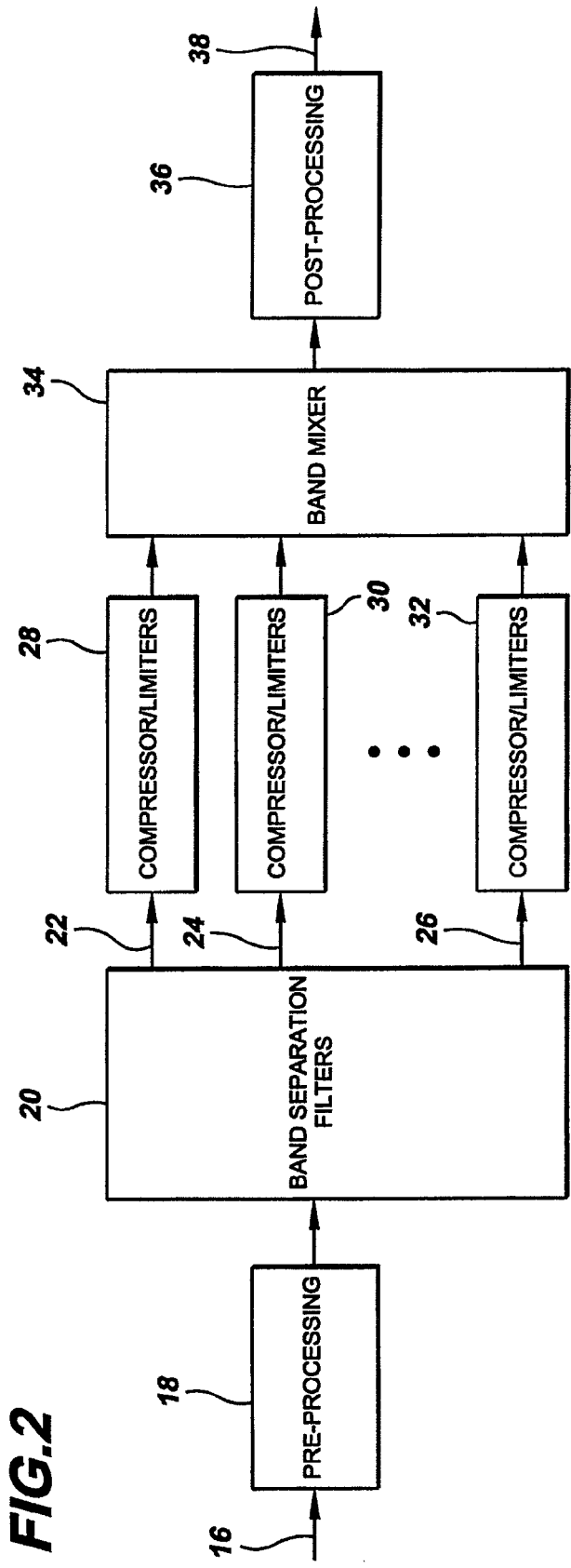
FIG. 2 is a block diagram showing the parallel processing method of operation of the audio signal processor in FIG. 1.

Referring to FIG. 2, the parallel method of operation of the audio signal processor 12 is shown. An audio signal to be processed arrives from the input circuit 10 via connection 16 to an optional pre-processing circuit 18. The pre-processing circuit 18 may be a separate analog or digital circuit, or it may be integrated into a DSP or other digital or analog processing system of the type described above. The pre-processing may do any conventional type of audio signal processing, such as initial gain adjustment, equalization, audio compression or audio amplitude limiting. The pre-processing may include known processing methods that include breaking the signal up into multiple audio frequency bands, although the bands will generally be much wider than the audio frequency bands used in the present invention.

The pre-processed audio signal is sent to a band separator 20, which includes multiple digital or analog audio filters having corresponding frequency pass bands. The band separator 20 separates the audio signal into distinct audio frequency bands. Three outputs 22, 24 and 26 are shown from the band separator 20 corresponding to two initial audio frequency bands 22, 24 and a final audio frequency band on output 26. Although any number of bands may be defined, it is contemplated that there will be more than 16 and preferably more than 30 bands. Many more than 30 may be used.

Each audio frequency band has a corresponding primary band frequency. Typically, this will be the center frequency of the pass band for the associated band filter. The audio frequency bands are configured so that at least some of the primary band frequencies are harmonics of other primary band frequencies. For example, one audio frequency band may have a primary band frequency of 500 Hz. Another audio frequency band may have a primary band frequency of 1000 Hz and still another may have a primary band frequency of 2000 Hz.

The frequency-separated audio signals are then processed using an audio processing technique in band processors 28, 30 and 32. The audio processing technique may be audio compression, audio amplitude limiting, amplification or gain reductions, or any other known type of processing, including unity gain processing which produces no change in the audio signal. The audio signal processor then determines an initial gain adjustment factor for each primary band frequency. The initial gain adjustment factor for each primary band frequency is deteintined from the audio processing technique applied to the audio signal in the corresponding audio frequency band.

In the preferred design, these initial gain adjustment factors are stored and organized into a set of initial gain adjustment factors for each primary band frequency that is a harmonic of at least one other primary band frequency. The set of initial gain adjustment factors includes at least the initial gain adjustment factor corresponding to the primary band frequency, and the initial gain adjustment factors corresponding to the other primary band frequency.

The set of initial gain adjustment factors for an audio frequency band having a primary band frequency f will include the initial gain adjustment factor for that band at frequency f and one or more additional initial gain adjustment factors for other band frequencies, such as f/2, f/3, f/4, etc. The band frequency f is the second harmonic of the band frequency f/2 and the third harmonic of the band frequency f/3. If the audio signal is divided up into multiple bands, including bands centered at 6,000 Hz, 3,000 Hz and 2,000 Hz, the set for the 6,000 Hz band will include the initial gain adjustment factor for that frequency and one or more of the initial gain adjustment factors for 3,000 Hz and 2,000 Hz.

In the preferred design the audio processing is arranged so that a level change in any given band having frequency f will affect the level in other audio frequency bands that are harmonics of frequency f. More specifically, the audio processing of frequency f will produce an initial gain adjustment factor that will be found in the set for f and also in the set for 2f and/or 3f, etc.

In the preferred design, each set of initial gain adjustment factors includes at most three members, including an initial gain adjustment factors for a frequency f, a frequency f/2 and a frequency f/3. The lowest frequencies may omit f/2 and f/3 and some intermediate frequencies may be skipped depending upon the width and spacing of the separated frequency bands.

In one embodiment of the invention, the initial gain adjustment factors in each set are optionally weighted according to the harmonic level. Thus, the set for frequency f may include the initial gain adjustment factors G1, G2 and G3 corresponding to frequencies f, f/2 and f/3. The factors in the set may be weighted by values a, b and c so that the set includes weighted gain adjustment factors aG1 (a times G1), bG2 and cG3. By way of example, a may be unity, b may be one half and c may be one third. Any weighting factors greater or less than unity may be used.

When weighting factors are used, it is preferred that the same weighting factors be used for each set such that the gain adjustment factor corresponding to the highest frequency in each set is always weighted by the same amount, the gain adjustment factor for the second highest frequency is always weighted by the same amount, etc.

After the optional step of weighting the members of each set of gain factors, the audio signal processor selects a final gain adjustment factor for each audio frequency band from its corresponding set. In the preferred design, the audio signal processor selects the gain adjustment that produces the greatest change in signal level.

The audio signal processor then applies the selected gain adjustment factor to the corresponding audio frequency band to produce a processed and gain adjusted audio signal for each audio frequency band. Finally, the processed and gain adjusted audio signals from each audio frequency band are summed together in the band mixer 34 to produce a processed audio signal. The mixing within the band mixer 34 may optionally be accompanied with a gain adjustment for each band to provide equalization, or all bands may be summed without further change.

In one optional step of the method, after each audio frequency band is processed, an amplitude adjustment factor may be applied to that band that is independent of the final gain adjustment factor for that band. The amplitude adjustment factor is applied before final mixing within the band mixer 34.

After mixing, the processed audio signal may be fed into a post-processor 36 for optional additional audio processing, which may include equalization, filtering, compression limiting, noise gating or any other type of signal processing. The signal is then passed to the output circuit 14 via connection 38.

To illustrate the functioning of the preferred embodiment of the invention, if a given band by itself required a gain reduction of 2 dB (for frequency f) and this same band was the third harmonic of a band which required 4 dB of reduction (for frequency f/3) and it was the second harmonic of a band requiring 3 dB of reduction (for frequency f/2), the total reduction in this band would be 4 dB. The audio signal processor would select the initial gain adjustment factor of 4 dB of reduction, as that would produce the maximum change in signal level.

Referring to FIG. 3, an alternative embodiment of the present invention is illustrated in which the audio frequency bands are separated and processed serially. The audio signal is first processed in optional pre-processing circuit 18. As described above, the pre-processing circuit 18 may be a separate analog or digital circuit, or it may be integrated into a DSP or other digital or analog processing system. The pre-processing may do any conventional type of audio signal processing, such as initial gain adjustment, equalization, audio compression or audio amplitude limiting. The pre-processing may include known processing methods that include breaking the signal up into multiple audio frequency bands, although the bands will generally be much wider than the audio frequency bands used in the present invention.

Following pre-processing, the pre-processed audio signal is sent to a first band processor 40, then to a second band processor, etc. until it reaches the last band processor 44. Each band processor receives the entire signal, but operates only upon the frequencies that fall within a defined audio frequency band without significantly affecting audio signals outside its corresponding frequency band. Each audio frequency band defines a corresponding primary band frequency as described above.

The first band processor 40 generally corresponds to band processor 28 in the parallel processing design of FIG. 2. The second band processor 42 generally corresponds to band processor 30 in the parallel processing design and the last band processor 44 generally corresponds to the last band processor 32 in the parallel processing design of FIG. 2.

In the same manner described for band processors 28, 30 and 32, each band processor 40, 42 and 44 (as well as the intervening band processors, not shown) applies an audio processing technique, such as, audio compression, audio amplitude limiting, amplification or gain reductions, or any other known type of processing. The audio signal processor (which may implement the band processors as software routines or in other digital or analog hardware) determines an initial gain adjustment factor for each primary band frequency. The initial gain adjustment factor for each primary band frequency is determined from the audio processing technique applied to the audio signal in the corresponding audio frequency band.

In the serial design of FIG. 3, the first band processor 40 will have the lowest primary band frequency. The audio signal processor will then determine an initial gain adjustment factor and apply that gain factor as the final gain adjustment factor. The signal will then be passed to the second band processor 42.

The second band processor 42 will have the second lowest primary band frequency. If the primary band frequency of the second band processor 42 is a harmonic of the first band frequency (i.e., the lowest frequency), the audio signal processor will form a set of initial gain adjustment factors comprising the initial gain adjustment factors for the first and second lowest frequencies.

As described for the parallel processing system, the audio signal processor will then select one of the initial gain adjustment factors from the set and apply it as the final gain adjustment factor to the frequencies within the frequency band operated on by the second band processor 42. In the preferred design, the selected gain adjustment factor is the gain adjustment factor that produces the greatest change in signal level. After processing by the second band processor 42, the signal will have frequencies processed by the first and second band processors and unprocessed higher frequencies.

The signal then proceeds to higher and higher frequency band processors. The third band processor will have the third lowest primary band frequency, and the audio signal processor will determine an initial gain adjustment factor and form a set of initial gain adjustment factor from previous band processors that have the band frequency being processed as a harmonic frequency.

As the processing works from the lowest frequencies in the first band processor 40 to the highest frequencies in the last band processor 44, each set of initial gain adjustment factors is identified. The processor selects one from the set to be the final gain adjustment factor as previously described. The factors may be weighted, if desired, and the final gain adjustment is applied. That is, the initial gain adjustment factor corresponding to the lowest frequency may be weighted by a first weighting factor (e.g., weighted by values a, b or c), the initial gain adjustment factor corresponding to the second harmonic of the lowest frequency may be weighted by a second weighting factor and the initial gain adjustment factor corresponding to the third harmonic of the lowest frequency may be weighted by a third weighting factor. After passing through the last band processor 44, the signal is sent to the post-processor 36. The result of this sequential processing is an audio signal that is substantially identical to the processed audio signal produced using parallel processing according to the embodiment in FIG. 2.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for processing an audio signal comprising:
   separating the audio signal into multiple audio frequency bands, each audio frequency band having a corresponding primary band frequency, at least some of the primary band frequencies being harmonics of other primary band frequencies;
   processing the audio signal in each audio frequency band with an associated audio processing technique;
   determining an initial gain adjustment factor for each primary band frequency, the initial gain adjustment factor for each primary band frequency being determined from the audio processing technique as applied to the audio signal in the corresponding audio frequency band;
   identifying a set of initial gain adjustment factors for each primary band frequency that is a harmonic of at least one other primary band frequency, the set of initial gain adjustment factors including at least:
   the initial gain adjustment factor corresponding to the primary band frequency, and,
   the initial gain adjustment factor corresponding to the at least one other primary band frequency;
   selecting a final gain adjustment factor for each audio frequency band from the corresponding set of initial gain adjustment factors;
   applying each final gain adjustment factor to the corresponding audio frequency band to produce a processed and gain adjusted audio signal for each audio frequency band; and
   mixing the processed and gain adjusted audio signals from each audio frequency band to produce a final processed audio signal.

2. The method for processing an audio signal according to claim 1 wherein the step of selecting a final gain adjustment factor for each audio frequency band from the corresponding set of initial gain adjustment factors comprises selecting the initial gain adjustment factor from the corresponding set of initial gain adjustment factors that produces the maximum change in audio signal amplitude.

3. The method for processing an audio signal according to claim 1 wherein the step of selecting a final gain adjustment factor for each audio frequency band from the corresponding set of initial gain adjustment factors comprises selecting the initial gain adjustment factor from the corresponding set of initial gain adjustment factors that produces the greatest reduction in audio signal amplitude.

4. The method for processing an audio signal according to claim 1 wherein the set of initial gain adjustment factors for each primary band frequency includes at least: the initial gain adjustment factor corresponding to the primary band frequency for the set; the initial gain adjustment factor corresponding to a second primary band frequency, the primary band frequency for the set comprising a second harmonic of the second primary band frequency; and the initial gain adjustment factor corresponding to a third primary band frequency, the primary band frequency for the set comprising a third harmonic of the third primary band frequency.

5. The method for processing an audio signal according to claim 1 further including the step of weighting one or more gain adjustment factors in each set of initial gain adjustment factors and the step of selecting a final gain adjustment factor for each audio frequency band from the corresponding set of initial gain adjustment factors comprises selecting a weighted one of the initial gain adjustment factors as the final gain adjustment factor.

6. The method for processing an audio signal according to claim 5 wherein the step of weighting one or more gain adjustment factors in each set of initial gain adjustment factors comprises weighting according to the harmonic level relationship between the primary band frequencies that correspond to the gain adjustment factors in each set of initial gain adjustment factors.

7. The method for processing an audio signal according to claim 6 wherein the step of selecting a final gain adjustment factor for each audio frequency band includes selecting the weighted gain adjustment factor from each corresponding set of weighted gain adjustment factors that produces the maximum change in audio signal amplitude.

8. The method for processing an audio signal according to claim 1 wherein:
   each set of initial gain adjustment factors defines a corresponding set of primary band frequencies;
   each set of primary band frequencies includes a lowest frequency, a second harmonic of the lowest frequency and a third harmonic of the lowest frequency; and the initial gain adjustment factor corresponding to the lowest frequency is weighted by a first weighting factor, the initial gain adjustment factor corresponding to the second harmonic of the lowest frequency is weighted by a second weighting factor and the initial gain adjustment factor corresponding to the third harmonic of the lowest frequency is weighted by a third weighting factor.

9. The method for processing an audio signal according to claim 1 wherein the audio frequency bands are processed in parallel by performing the step of separating the audio signal into multiple audio frequency bands for all audio frequency bands before the step of processing the audio signal in each audio frequency band.

10. The method for processing an audio signal according to claim 1 wherein the audio frequency bands are processed serially by performing the step of processing the audio signal in a specific audio frequency band immediately after the step of separating said specific audio frequency band and before separating and processing other audio frequency bands.

11. The method for processing an audio signal according to claim 10 wherein the serial processing of audio frequency bands proceeds from lower frequencies to higher frequencies.

12. The method for processing an audio signal according to claim 1 further including the step of pre-processing the audio signal with at least one audio processing technique before the step of separating the audio signal into multiple audio frequency bands.

13. The method for processing an audio signal according to claim 1 further including the step of post-processing the audio signal with at least one audio processing technique after the step of mixing the processed and gain adjusted audio signals from each audio frequency band to produce a final processed audio signal.

14. The method for processing an audio signal according to claim 1 further including the step of applying an amplitude adjustment factor to each processed and gain adjusted audio signal from each audio frequency band, the amplitude adjustment factor for each audio frequency band being independent of the final gain adjustment factor for each audio frequency band.

15. The method for processing an audio signal according to claim 1 wherein the step of separating the audio signal into multiple audio frequency bands comprises separating the audio signal into more than 30 distinct audio frequency bands.

16. Apparatus for processing an audio signal comprising: an input for receiving the audio signal; an audio signal processor for processing the audio signal in each audio frequency band with an associated audio processing technique; the audio signal processor separating the audio signal into multiple audio frequency hands, each audio frequency band having a corresponding primary band frequency, at least some of the primary band frequencies being harmonics of other primary band frequencies; the audio signal processor determining an initial gain adjustment factor for each primary band frequency, the initial gain adjustment factor for each primary band frequency being determined from the audio processing technique as applied to the audio signal in the corresponding audio frequency band; the audio signal processor identifying a set of initial gain adjustment factors for each primary band frequency that is a harmonic of at least one other primary band frequency, the set of initial gain adjustment factors including at least: the initial gain adjustment factor corresponding to the primary band frequency, and the initial gain adjustment factor corresponding to the at least one other primary band frequency; the audio signal processor selecting a final gain adjustment factor for each audio frequency band from the corresponding set of initial gain adjustment factors; the audio signal processor applying each final gain adjustment factor to the corresponding audio frequency band to produce a processed and gain adjusted audio signal for each audio frequency band; and the audio signal processor mixing the processed and gain adjusted audio signals from each audio frequency band to produce a final processed audio signal, and an output for outputting the processed audio signal.

17. The apparatus for processing an audio signal according to claim 16 wherein the audio signal processor is a digital signal processor.

18. The apparatus for processing an audio signal according to claim 16 wherein the audio signal processor selects a final gain adjustment factor for each audio frequency band from the corresponding set of initial gain adjustment factors by selecting the initial gain adjustment factor from the corresponding set of initial gain adjustment factors that produces the greatest reduction in audio signal amplitude.

19. The apparatus for processing an audio signal according to claim 16 wherein the set of initial gain adjustment factors for each primary band frequency includes at least: the initial gain adjustment factor corresponding to the primary band frequency for the set; the initial gain adjustment factor corresponding to a second primary band frequency, the primary band frequency for the set comprising a second harmonic of the second primary band frequency; and the initial gain adjustment factor corresponding to a third primary band frequency, the primary band frequency for the set comprising a third harmonic of the third primary band frequency.

20. The apparatus for processing an audio signal according to claim 16 wherein the audio signal processor weights one or more gain adjustment factors in each set of initial gain adjustment factors and selects a weighted one of the initial gain adjustment factors as the final gain adjustment factor.

21. The apparatus for processing an audio signal according to claim 20 wherein the audio signal processor weights gain adjustment factors in each set of initial gain adjustment factors according to the harmonic level relationship between the primary band frequencies that correspond to the gain adjustment factors in each set of initial gain adjustment factors.

22. The apparatus for processing an audio signal according to claim 16 wherein:
each set of initial gain adjustment factors defines a corresponding set of primary band frequencies;
each set of primary band frequencies includes a lowest frequency, a second harmonic of the lowest frequency and a third harmonic of the lowest frequency; and
the initial gain adjustment factor corresponding to the lowest frequency is weighted by the audio signal processor with a first weighting factor, the initial gain adjustment factor corresponding to the second harmonic of the lowest frequency is weighted by a second weighting factor and the initial gain adjustment factor corresponding to the third harmonic of the lowest frequency is weighted by a third weighting factor.

23. The apparatus for processing an audio signal according to claim 16 wherein the audio signal processor separates the audio signal into more than 30 distinct audio frequency bands.

* * * * *

UNITED STATES PATENT AND TRADEMARK OFFICE
CERTIFICATE OF CORRECTION

Page 1 of 1

PATENT NO. : 7,991,171 B1
APPLICATION NO. : 11/734947
DATED : August 2, 2011
INVENTOR(S) : Gary C. Snow It is certified that error appears in the above-identified patent and that said Letters Patent is hereby corrected as shown below:

At Column 11, line 51: Delete "hands" and insert therefor -- bands --.

Signed and Sealed this
Twenty-fifth Day of October, 2011

David J. Kappos
*Director of the United States Patent and Trademark Office*